(12) United States Patent
Takahashi et al.

(10) Patent No.: US 11,393,911 B2
(45) Date of Patent: Jul. 19, 2022

(54) METHOD OF MANUFACTURING SEMICONDUCTOR DEVICE AND SEMICONDUCTOR DEVICE

(71) Applicant: SHINDENGEN ELECTRIC MANUFACTURING CO., LTD., Tokyo (JP)

(72) Inventors: Teppei Takahashi, Saitama (JP); Tetsuto Inoue, Saitama (JP); Akihiko Sugai, Saitama (JP); Takashi Mochizuki, Saitama (JP); Shunichi Nakamura, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 17/046,762

(22) PCT Filed: Apr. 11, 2018

(86) PCT No.: PCT/JP2018/015166
§ 371 (c)(1),
(2) Date: Oct. 9, 2020

(87) PCT Pub. No.: WO2019/198168
PCT Pub. Date: Oct. 17, 2019

(65) Prior Publication Data
US 2021/0119008 A1    Apr. 22, 2021

(51) Int. Cl.
*H01L 29/45* (2006.01)
*H01L 21/04* (2006.01)
(Continued)

(52) U.S. Cl.
CPC .......... *H01L 29/45* (2013.01); *H01L 21/0465* (2013.01); *H01L 21/0485* (2013.01);
(Continued)

(58) Field of Classification Search
CPC . H01L 29/04; H01L 29/0465; H01L 29/0485; H01L 29/10; H01L 29/1095;
(Continued)

(56) References Cited

U.S. PATENT DOCUMENTS

2015/0171170 A1   6/2015   Yamada et al.
2015/0372095 A1   12/2015   Saito et al.
(Continued)

FOREIGN PATENT DOCUMENTS

JP    2015115569 A    6/2015
JP    2016058657 A    4/2016
(Continued)

OTHER PUBLICATIONS

International Search Report in the international application No. PCT/JP2018/015166, dated Jun. 5, 2018.
(Continued)

*Primary Examiner* — Fazli Erdem
(74) *Attorney, Agent, or Firm* — Ladas & Parry, LLP

(57) ABSTRACT

A semiconductor device has: a semiconductor substrate; a drift layer of a first conductivity type; a well region of a second conductivity type; a high-concentration region of the second conductivity type, a source region of the first conductivity type; an insulating film provided on the drift layer; a first contact metal film in contact with the source region and the high-concentration region through a first opening provided in the insulating film; and a second contact metal film formed on a surface of the first contact metal film and contacting the high-concentration region through a second opening provided in the first contact metal film; a source electrode film formed on a surface of a contact metal layer including the first contact metal film and the second contact metal film. The first contact metal film includes titanium nitride, and the second contact metal film includes titanium.

8 Claims, 12 Drawing Sheets

(51) Int. Cl.
  *H01L 29/10* (2006.01)
  *H01L 29/16* (2006.01)
  *H01L 29/66* (2006.01)
  *H01L 29/78* (2006.01)

(52) U.S. Cl.
  CPC ...... *H01L 29/1095* (2013.01); *H01L 29/1608* (2013.01); *H01L 29/66068* (2013.01); *H01L 29/7802* (2013.01)

(58) Field of Classification Search
  CPC ..... H01L 29/16; H01L 29/1608; H01L 29/45; H01L 29/66; H01L 29/66068; H01L 29/78; H01L 29/7802; H01L 29/7816
  USPC ......................................................... 257/77
  See application file for complete search history.

(56) References Cited

U.S. PATENT DOCUMENTS

2016/0126319 A1  5/2016  Ogino
2017/0084699 A1*  3/2017  Hoshi ................ H01L 29/1608
2017/0194438 A1  7/2017  Kumagai et al.

FOREIGN PATENT DOCUMENTS

| JP | 2016092038 A | 5/2016 |
| JP | 2017059720 A | 3/2017 |
| JP | 2017147471 A | 8/2017 |
| JP | 2017157851 A | 9/2017 |

OTHER PUBLICATIONS

Written Opinion of the International Searching Authority in the international application No. PCT/JP2018/015166, dated Jun. 5, 2018 and English translation provided by Google Translate.
International Preliminary Report on Patentability in the international application No. PCT/JP2018/015166, dated Nov. 9, 2018, with English translation provided by Google Translate.
Extended European Search Report from EP app. No. 18914473.6, dated Nov. 5, 2021, all pages.

* cited by examiner

METHOD OF MANUFACTURING SEMICONDUCTOR DEVICE AND SEMICONDUCTOR DEVICE

CROSS-REFERENCE TO RELATED APPLICATION

The present application is the U.S. national phase of PCT Application PCT/JP2018/015166 filed on Apr. 11, 2018, the disclosure of which is incorporated herein by reference in its entirety.

TECHNICAL FIELD

The present invention relates to a method of manufacturing a semiconductor device and a semiconductor device.

BACKGROUND ART

Silicon carbide (SiC) has a dielectric breakdown electric field strength approximately 10 times that of silicon (Si), and is therefore used as a material for high breakdown voltage semiconductor devices.

In a semiconductor device (e.g., metal-oxide-semiconductor field-effect transistor (MOSFET)) using a semiconductor substrate (e.g., n-type SiC), a drift layer and an electrode film (e.g., an alloy including aluminum and silicon (Al—Si) or aluminum (Al)) are electrically and mechanically connected by a contact metal film (see, for example, Patent Literature 1).

CITATION LIST

Patent Literature

Patent Literature 1: JP 2016-92038 A

SUMMARY OF INVENTION

Technical Problem

The present inventors have revealed that a film of titanium nitride (TiN) is formed as a contact metal film on a semiconductor substrate and then an electrode film of an alloy including aluminum and silicon, an alloy including aluminum and copper, or aluminum is formed, whereby an ohmic contact can be formed. However, this structure has a problem that contact resistance becomes high at an interface between a high-concentration region ($SiC(p^+)$) of a p-type impurity formed in an n-type drift layer of a MOSFET and titanium nitride.

It is desirable that the contact resistance between the high-concentration region of the p-type impurity formed in the drift layer and the contact metal film be reduced as much as possible. Otherwise, the potential of the high-concentration region rises when the MOSFET is turned off, which may cause the operation or the like of a parasitic bipolar transistor.

For example, when the contact metal film is of nickel (Ni), the contact resistance can be expected to be reduced. Patent Literature 1 describes that a region of silicon carbide in which a p-type impurity is introduced at a high concentration is joined to nickel. However, there is a problem that when an interface between the region of silicon carbide in which the p-type impurity is introduced at a high concentration and the nickel is annealed, free carbon is generated due to the formation of nickel silicide, and adhesion between the silicon carbide and the contact metal film decreases. Additionally, there is a problem that when different contact metals are tried to be used between an n-type region and a p-type region, it is necessary that contact metal formed in the n-type region and contact metal formed in the p-type region are provided while being separated from each other, and therefore, it is necessary to provide a margin when using a publicly known photolithography technique.

The present invention has been made in view of such problems, and it is an object thereof is to provide a highly reliable semiconductor device and a method of manufacturing thereof.

A semiconductor device according to an aspect of the present invention may comprise:
a semiconductor substrate made of silicon carbide;
a drift layer of a first conductivity type and provided on one main surface of the semiconductor substrate;
a well region of a second conductivity type and provided in the drift layer;
a high-concentration region of the second conductivity type, provided in the well region and having an impurity concentration higher than an impurity concentration of the well region;
a source region of the first conductivity type and provided adjacent to the high-concentration region;
an insulating film provided on the drift layer;
a first contact metal film in contact with the source region and the high-concentration region through a first opening provided in the insulating film; and
a second contact metal film formed on a surface of the first contact metal film and contacting the high-concentration region through a second opening provided in the first contact metal film;
a source electrode film formed on a surface of a contact metal layer including the first contact metal film and the second contact metal film, wherein
the first contact metal film may include titanium nitride, and
the second contact metal film may include titanium.

A method of manufacturing a semiconductor device according to an aspect of the present invention may comprise:
a drift layer forming step of forming a drift layer of a first conductivity type on one main surface of a semiconductor substrate made of silicon carbide;
a well region forming step of forming a well region of a second conductivity type opposite to the first conductivity type in the drift layer, the well region being exposed on a surface of the drift layer;
a high-concentration region forming step of forming a high-concentration region of the second conductivity type in the well region of the drift layer, the high-concentration region being exposed on the surface of the drift layer, the high-concentration region having a higher impurity concentration than an impurity concentration in the well region;
a source region forming step of forming a source region of the first conductivity type in the well region of the drift layer, the source region being exposed to the surface of the drift layer, the source region being adjacent to the high-concentration region;
an insulating film forming step of forming an insulating film on the surface of the drift layer, the insulating film having an insulating film having a first opening exposing the high-concentration region and at least a part of the source region in a plan view viewed from a side of the one main surface of the semiconductor substrate;

a first contact metal film forming step of forming a first contact metal film having a second opening exposing a part of the high-concentration region so that the first contact metal film is in contact with at least a part of the source region in the first opening;

a second contact metal film forming step of forming a second contact metal film on a surface of the first contact metal film so that the second contact metal film is in contact with the high-concentration region in the second opening; and a source electrode film forming step of forming a source electrode film on a surface of a contact metal layer including the first contact metal film and the second contact metal film, wherein the first contact metal film may include titanium nitride, and the second contact metal film may include titanium.

Advantageous Effects of Invention

According to the semiconductor device and the method of manufacturing a semiconductor device of the present invention, an improvement in the adhesion of a contact metal layer in a high-concentration region and a reduction in contact resistance can be achieved. Thus, a highly reliable semiconductor device can be provided.

DESCRIPTION OF EMBODIMENTS

First Embodiment

Figure 1:
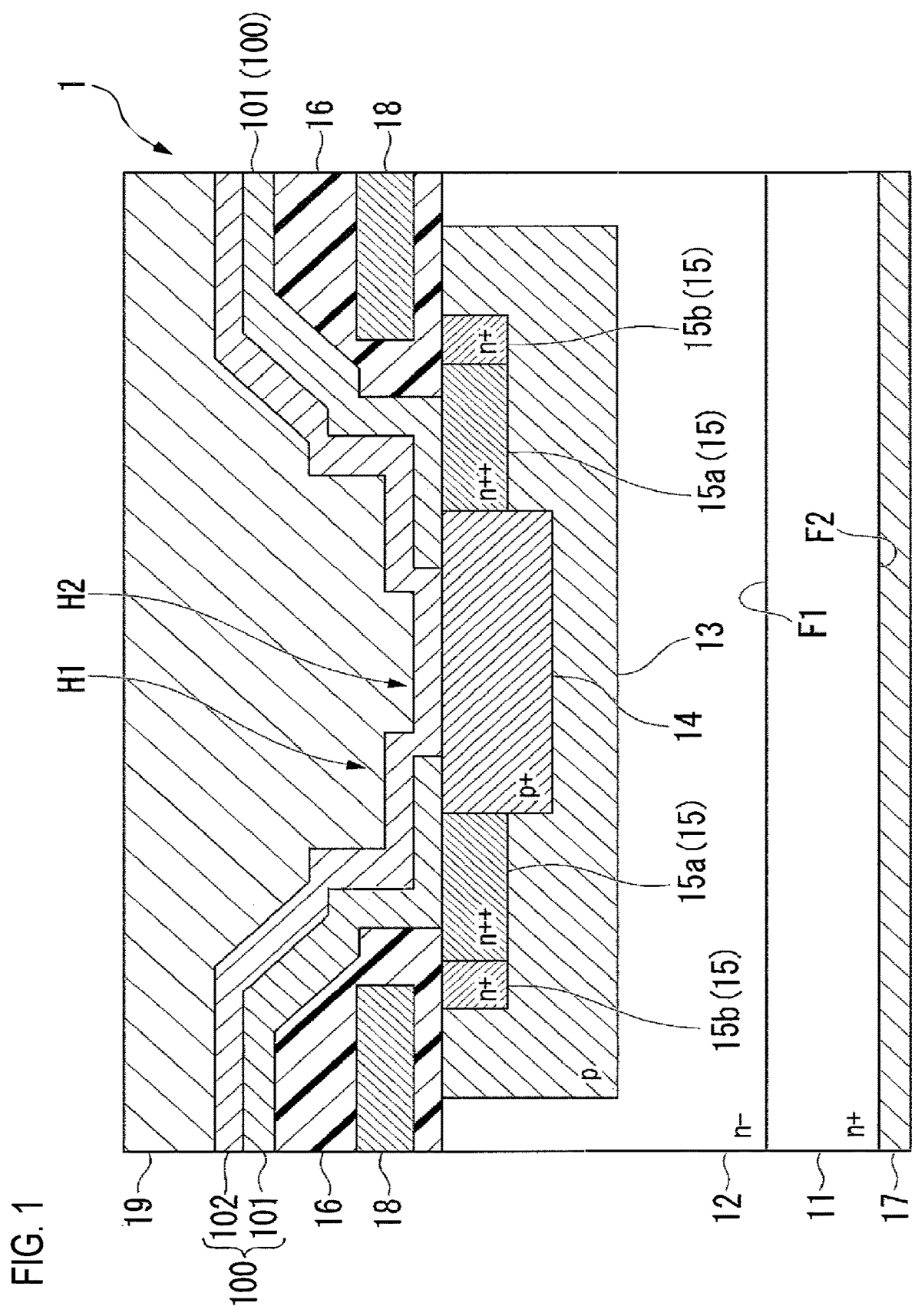
FIG. 1 is a cross-sectional view showing a configuration of a semiconductor device according to a first embodiment.

Hereinafter, a first embodiment of the present invention will be described with reference to FIGS. 1 to 5.

(Configuration of Semiconductor Device)

Hereinafter, a configuration of a semiconductor device according to the present embodiment will be described with reference to FIG. 1. The semiconductor device according to the present embodiment is a planar MOSFET. Note that in the semiconductor device according to the present embodiment, a plurality of semiconductor elements is arranged adjacent to each other, but FIG. 1 shows only one of these semiconductor elements.

Note that the present embodiment is specifically described for better understanding of the gist of the invention and does not limit the present invention unless otherwise specified. Additionally, there are cases where main parts in the drawings to be used in the following description are enlarged for convenience in order to facilitate understanding of features of the present invention, and the dimensional ratios of respective constituent elements are not necessarily the same as those in reality.

As shown in FIG. 1, a semiconductor device 1 includes a semiconductor substrate 11, a drift layer 12, a well region 13, a high-concentration region 14, a source region 15, an insulating film 16, a contact metal layer 100, and a source electrode film 19. The semiconductor device 1 further includes a drain electrode 17 and a gate electrode 18.

The semiconductor substrate 11 is made of silicon carbide (SiC) and has an n-type (first conductivity type) impurity introduced therein. The semiconductor substrate 11 is an $n^+$-type silicon carbide single crystal substrate. The semiconductor substrate 11 is, for example, a (0001) plane n-type 4H—SiC substrate.

The drift layer 12 is made of silicon carbide and is formed on one main surface F1 of the semiconductor substrate 11.

An n-type impurity is introduced into the drift layer 12 at a concentration lower than a concentration in the semiconductor substrate 11.

The drain electrode 17 is formed on another main surface F2 of the semiconductor substrate 11. The drain electrode 17 and the semiconductor substrate 11 are in ohmic contact with each other. The drain electrode 17 may be formed of, for example, titanium nitride.

The well region 13 is formed in a part of a surface of the drift layer 12 opposite to the semiconductor substrate 11. A P-type (second conductivity type) impurity is introduced into the well region 13.

The high-concentration region 14 is formed on a part of a surface of the well region 13. A P-type impurity is introduced into the high-concentration region 14 at a higher concentration than a concentration in the well region 13. Thus, the operation of a parasitic bipolar transistor in the semiconductor device 1 can be suppressed.

The source region 15 is formed on a part of the surface of the well region 13. An n-type impurity is introduced into the source region 15 at a higher concentration than a concentration in the drift layer 12. The source region 15 is surrounded by the well region 13 in a plan view viewed from a side of the one main surface F1 of the semiconductor substrate 11 (hereinafter, may be simply referred to as "plan view").

In the present embodiment, the source region 15 is formed in an annular shape so as to surround the high-concentration region 14 in a plan view. As shown in FIG. 1, in the present embodiment, the source region 15 includes a first source region 15a having an annular shape in a plan view in which an n-type impurity is introduced at a relatively high concentration and a second source region 15b in which an n-type impurity is introduced outside the first source region 15a at a relatively low concentration. However, a configuration of the source region 15 is not limited to this.

The insulating film 16 is made of an insulating material and is formed on a surface of the drift layer 12. The insulating film 16 has a first opening H1. The first opening H1 is formed so that at least a part of the source region 15 and at least a part of a high-concentration second conductivity type region 14 are exposed in a plan view. In the present embodiment, the first opening H1 is formed so that a part of the first source region 15a is exposed.

The gate electrode 18 is formed so as to straddle a region of the well region 13 in which the source region 15 is not formed, and a region of the drift layer 12 facing across the region of the well region 13 in which the source region 15 is not formed, and the source region 15 in a plan view. Furthermore, the gate electrode 18 may be formed so as to straddle another well region (not shown) facing the well region 13 across the drift layer 12 and a source region (not shown) facing across the other well region.

Even if a forward bias voltage is applied between the source region 15 and the drain electrode 17 in a state in which no voltage is applied to the gate electrode 18 (or a state in which a negative voltage is applied), no current flows between the source region 15 and the drain electrode 17. When a positive voltage is applied to the gate electrode 18 in a state in which a forward bias voltage is applied between the source region 15 and the drain electrode 17, an inversion channel whose conductivity type is inverted from a conductivity type of the well region 13 is formed on a surface of a region of the well region 13 facing the gate electrode 18. As a result, a current flows between the source region 15 and the drain electrode 17. That is, by applying a voltage to the gate electrode 18, the current between the source region 15 and the drain electrode 17 can be controlled.

The contact metal layer 100 includes a first contact metal film 101 and a second contact metal film 102.

The first contact metal film 101 is formed so as to be in contact with the source region 15 and the high-concentration region 14 in the first opening H1. The first contact metal film 101 has a second opening H2 formed so that a part of the high-concentration region 14 is exposed. The first contact metal film 101 is formed of titanium nitride. A contact metal film 101 is formed so as to be in contact with a part of the first source region 15a that is the source region 15 exposed in the first opening H1. Additionally, the contact metal film 101 is formed so as to be in contact with a part of the high-concentration region 14 located in a part of the source region 15 formed in an annular shape in a plan view. The second opening H2 is formed so that the central part of the high-concentration region 14 is exposed.

The second contact metal film 102 is formed on a surface of the first contact metal film 101. The second contact metal film 102 is formed so as to be in contact with the central part of the high-concentration region 14 in the second opening H2. The second contact metal film 102 is formed of titanium. Note that titanium nitride may be further formed on a surface layer part of the second contact metal film 102.

The source electrode film 19 is formed on a surface of a contact metal film 100. Additionally, the source electrode film 19 is formed of an alloy including aluminum and silicon, an alloy including aluminum and copper, or aluminum. The source electrode film 19 connects the source regions 15 of the plurality of semiconductor elements to each other. In the present embodiment, the source electrode film 19 is formed on a surface of the second contact metal film 102.

In the semiconductor device 1 according to the present embodiment, nickel is not used for forming the contact metal film 100 (first contact metal film 101 and second contact metal film 102). Thus, free carbon is not generated during annealing, so that adhesion between the contact metal film 100 and silicon carbide (source region 15 and high-concentration region 14) can be improved.

In the semiconductor device 1 according to the present embodiment, the second contact metal film 102 in contact with the central part of the high-concentration region 14 is formed of titanium. Thus, contact resistance between the high-concentration region 14 (SiC(p$^+$)) including a p-type impurity and the contact metal film 100 can be reduced as compared with a case where the contact metal film 100 is entirely formed of titanium nitride.

As described above, according to the semiconductor device 1 of the present embodiment, an improvement in the adhesion of the contact metal film 100 in the high-concentration region 14 and a reduction in the contact resistance can be achieved. Thus, a highly reliable semiconductor device can be provided.

Additionally, in the semiconductor device 1 according to the present embodiment, titanium is not used for forming the first contact metal film 101 of the contact metal film 100 in contact with the source region 15. Thus, a Schottky junction is not formed in an interface between the contact metal film 100 and the source region 15 including the n-type impurity. Therefore, an ohmic contact can be formed between the source region 15 and the source electrode film 19.

Additionally, in the semiconductor device 1 according to the present embodiment, the contact metal film 101 with respect to the source region 15 mainly including the n-type impurity and a contact metal film 102 with respect to the high-concentration region 14 including the p-type impurity are not separated from each other and instead are formed while being overlapped on the source region 15. As a result, a margin for a photolithography process can be reduced, so that a cell pitch of the semiconductor element can be reduced.

(Method of Manufacturing Semiconductor Device)

Hereinafter, a method of manufacturing the semiconductor device 1 according to the present embodiment will be described with reference to FIGS. 2 to 5.

Figure 2:
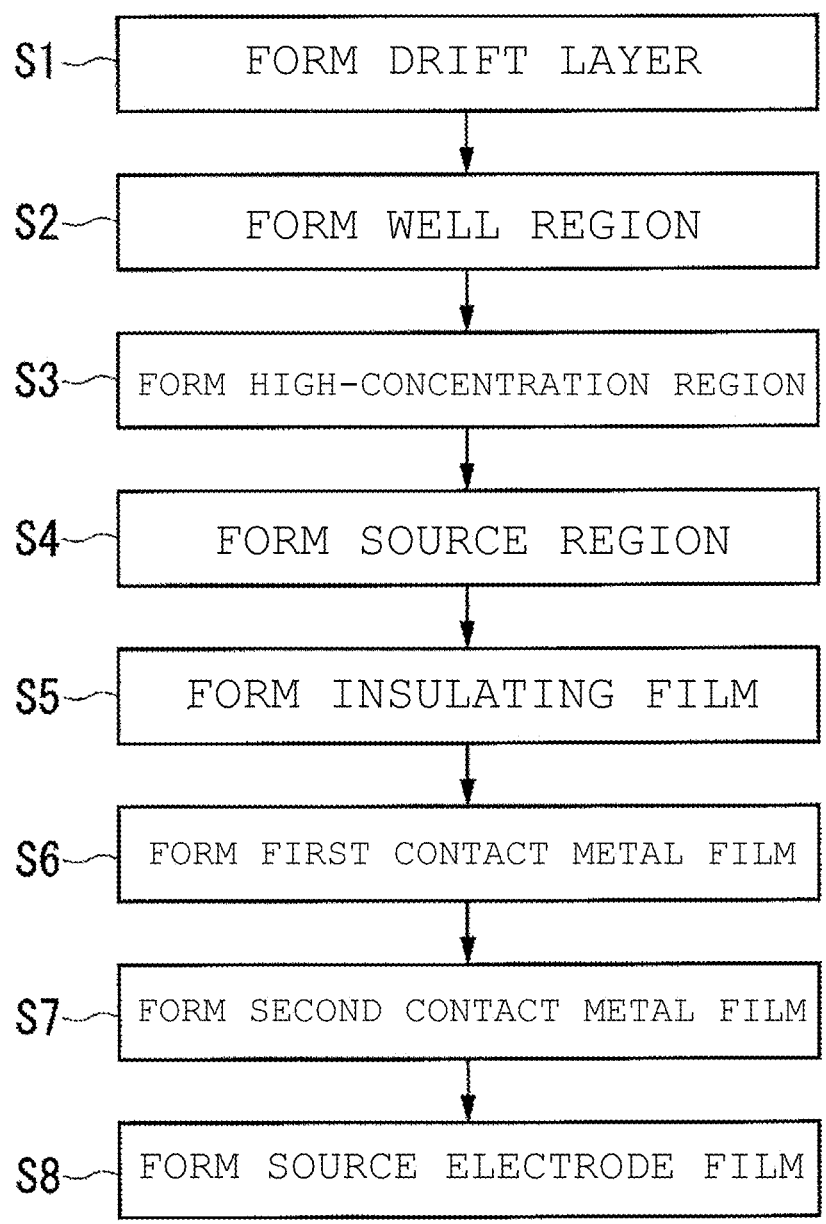
FIG. 2 is a flowchart showing a method of manufacturing the semiconductor device according to the first embodiment.

As shown in FIG. 2, the method of manufacturing the semiconductor device 1 according to the present embodiment includes a drift layer forming step S1, a well region forming step S2, a high-concentration region forming step S3, a source region forming step S4, an insulating film forming step S5, a first contact metal film forming step S6, a second contact metal film forming step S7, and a source electrode film forming step S8.

Hereinafter, each step of the method of manufacturing the semiconductor device 1 according to the present embodiment will be described with reference to FIGS. 3 to 5. Note that in the semiconductor device 1 according to the present embodiment, the plurality of semiconductor elements is arranged adjacent to each other, but FIGS. 3 to 5 show only one of these semiconductor elements.

(S1: Drift Layer Forming Step)

Figure 3A:
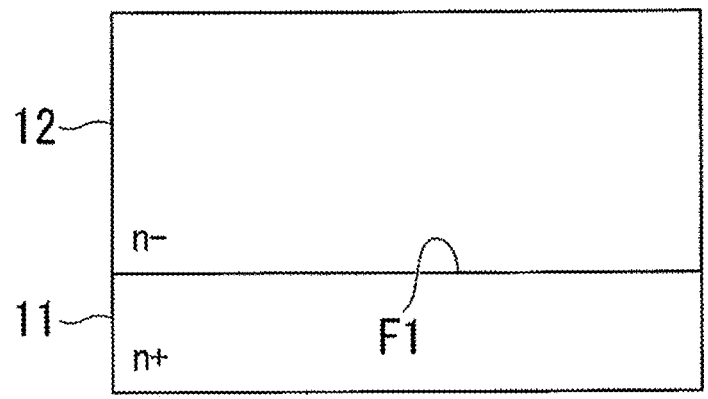
FIG. 3A is a cross-sectional view showing the method of manufacturing the semiconductor device according to the first embodiment.

First, the drift layer forming step S1 shown in FIG. 3A is performed. In the drift layer forming step S1, an n$^-$-type silicon carbide epitaxial layer is formed on the upper surface of the n+-type silicon carbide single crystal substrate by chemical vapor deposition (CVD). Thus, the drift layer 12 including an n$^-$-type silicon carbide epitaxial layer is formed on the one main surface F1 of the semiconductor substrate 11 of n-type made of silicon carbide.

(S2: Well Region Forming Step)

Figure 3B:
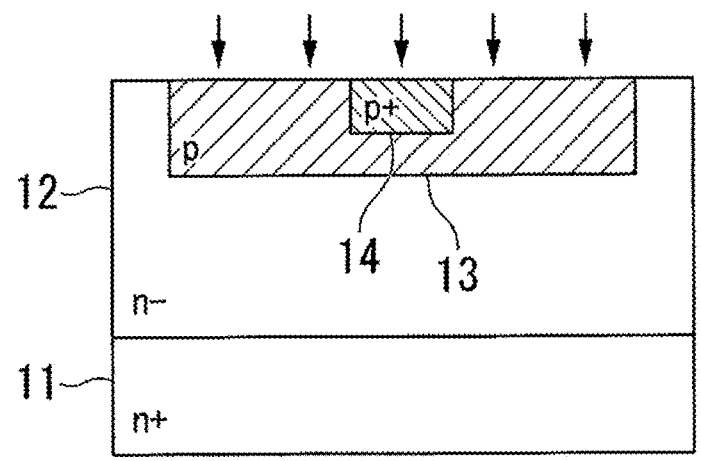
FIG. 3B is a cross-sectional view showing the method of manufacturing the semiconductor device according to the first embodiment.

Next, as shown in FIG. 3B, the well region forming step S2 and the high-concentration region forming step S3 are sequentially performed. In the well region forming step S2, first, the surface of the drift layer 12 is cleaned. Next, an oxide film (not shown) made of silicon dioxide (SiO$_2$) is formed on the surface of the drift layer 12. Next, a publicly known photolithography technique is used to form a resist pattern (not shown) only in a part in which a p-type impurity is not introduced. Then, the oxide film in a part not protected by the resist pattern is etched by reactive ion etching (RIE) to form a mask (not shown) having an opening in a part corresponding to the well region 13. Then, the resist pattern is removed. In this state, a p-type impurity (e.g., aluminum) is introduced into the drift layer 12 by ion implantation. After introducing the p-type impurity, the mask is removed. Thus, the well region 13 that is of p-type and exposed in a part of the drift layer 12 is formed.

(S3: High-Concentration Region Forming Step)

In the high-concentration region forming step S3, as in the well region forming step S2, a mask (not shown) having an opening is formed in a part of the well region 13 corresponding to the high-concentration region 14. In this state, a p-type impurity ion having a higher concentration than a concentration in the well region 13 is introduced into the well region 13 by ion implantation. After introducing the p-type impurity, the mask is removed. Thus, the high-concentration region 14 that is of p-type and exposed on the surface of the drift layer 12 and has a higher impurity concentration than an impurity concentration in the well region 13 is formed. The high-concentration region 14 may be formed, for example, between the source region forming step S4 and the insulating film forming step S5.

(S4: Source Region Forming Step)

Figure 3C:
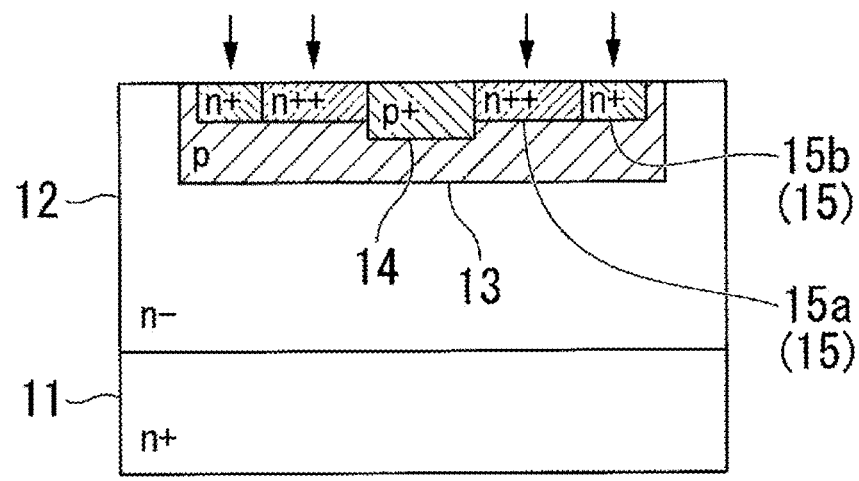
FIG. 3C is a cross-sectional view showing the method of manufacturing the semiconductor device according to the first embodiment.

Next, the source region forming step S4 shown in FIG. 3C is performed. In the source region forming step S4, first, as in the well region forming step S2, a mask (not shown) having an opening in a part corresponding to the first source region 15a is formed. In this state, an n-type impurity (e.g., phosphorus (P) or nitrogen (N)) is introduced into a part of the well region 13 of the drift layer 12 by ion implantation. After introducing the n-type impurity, the mask is removed. Thus, the first source region 15a exposed on a part of the surface of the well region 13 is formed. Additionally, the second source region 15b is also formed on a part of the surface of the well region 13 by a similar procedure.

In the well region forming step S2, the high-concentration region forming step S3, and the source region forming step S4, after introducing the impurities by ion implantation, annealing is performed at, for example, 1650° C. to 1800° C. in order to activate the implanted impurities.

(S5: Insulating Film Forming Step)

Figure 4A:
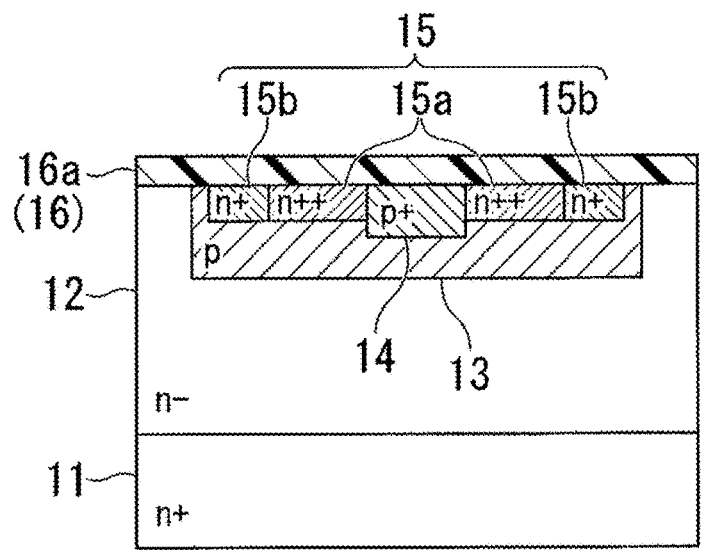
FIG. 4A is a cross-sectional view showing the method of manufacturing the semiconductor device according to the first embodiment.
Figure 4B:
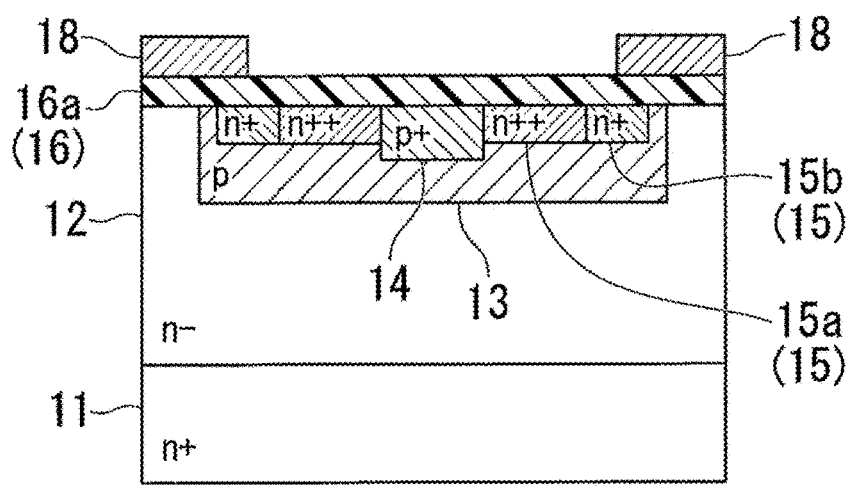
FIG. 4B is a cross-sectional view showing the method of manufacturing the semiconductor device according to the first embodiment.
Figure 4C:
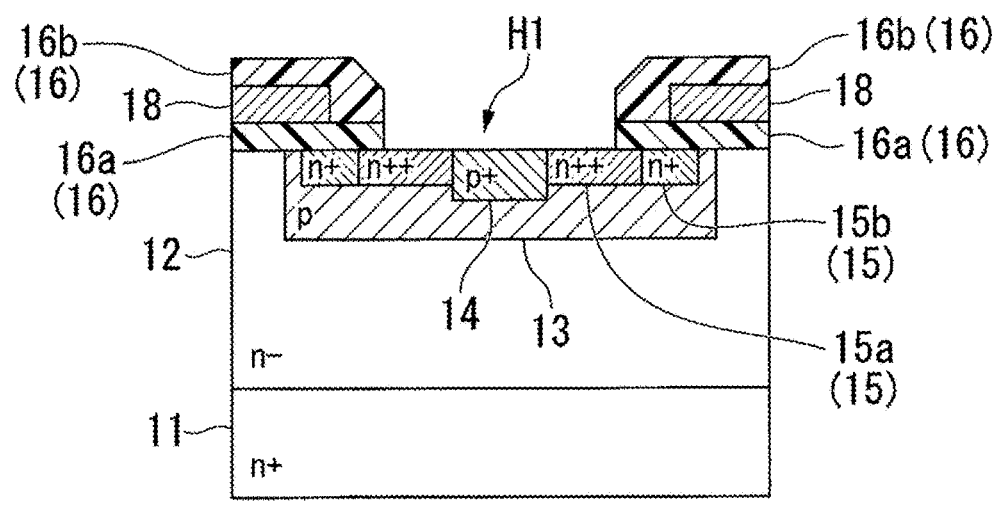
FIG. 4C is a cross-sectional view showing the method of manufacturing the semiconductor device according to the first embodiment.

Next, the insulating film forming step S5 shown in FIGS. 4A to 4C is performed. In the insulating film forming step S5, first, as shown in FIG. 4A, an oxide film 16a is formed on the surface of the drift layer 12. Then, a polysilicon film is formed on the oxide film 16a by chemical vapor deposition. After forming the polysilicon film, an n-type impurity (e.g., phosphorus) is introduced into the polysilicon film. After introducing the impurity, a publicly known photolithography technique is used to form a resist pattern (not shown) that protects a part corresponding to the gate electrode 18. Then, a part not protected by the resist pattern is removed by dry etching. Then, the resist pattern is removed. Thus, the gate electrode 18 is formed as shown in FIG. 4B. Next, a film of silicon dioxide is formed by chemical vapor deposition so as to cover the gate electrode 18 to form an oxide film 16b (see FIG. 4C). Then, a publicly known photolithography technique is used to form a resist pattern (not shown) having an opening in a part corresponding to an opening H1. Then, parts of the oxide films 16a and 16b that are not protected by the resist pattern are removed by dry etching. Then, the resist pattern is removed. Thus, as shown in FIG. 4C, the insulating film 16 including the oxide films 16a and 16b and having the first opening H1 formed so that the high-concentration region 14 and at least a part of the source region 15 are exposed in a plan view is formed on the surface of the drift layer 12.

(S6: First Contact Metal Film Forming Step)

Figure 5A:
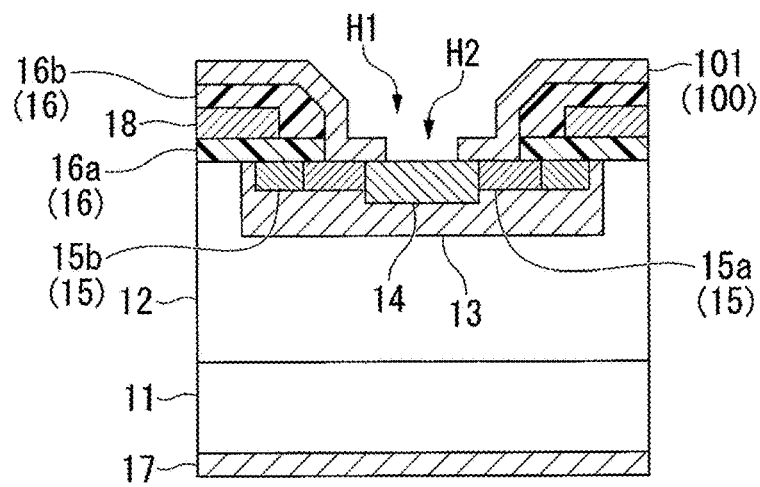
FIG. 5A is a cross-sectional view showing the method of manufacturing the semiconductor device according to the first embodiment.

Next, the first contact metal film forming step S6 shown in FIG. 5A is performed. In the first contact metal film forming step S6, first, a film of titanium nitride is formed on a surface of the insulating film 16 by sputtering in a mixed atmosphere of nitrogen (N$_2$) and argon (Ar) or a nitrogen (N$_2$) atmosphere, for example, at a substrate temperature of 150° C. to 350° C. Next, a publicly known photolithography technique is used to form a resist pattern (not shown) that has an opening corresponding to the second opening H2 and protects a part corresponding to the first contact metal film 101. Then, a part not protected by the resist pattern is removed by dry etching. Then, the resist pattern is removed. In the first contact metal film forming step S6, for example, a film of titanium nitride may also be formed on the other main surface F2 of the semiconductor substrate 11.

Next, annealing is performed. Annealing temperature is preferably, for example, 800 to 1000° C. and more preferably 950° C. At 1050° C. or higher, nitrogen atoms are said to diffuse from the titanium nitride forming a contact metal 101 into p-type silicon carbide. This is not preferable because the contact resistance of a p-type silicon carbide part increases. An annealing atmosphere is preferably an inert gas such as nitrogen, argon, or a mixed gas thereof. Thus, the first contact metal film 101 having the pattern corresponding to the second opening H2 in which the part of the high-concentration region 14 is exposed is formed so that the first contact metal film 101 is in contact with the source region 15 and the high-concentration region 14 in the first opening H1. At the same time, the drain electrode 17 to be connected to the drift layer 12 in an ohmic manner via the semiconductor substrate 11 is formed on the other main surface F2 of the semiconductor substrate 11.

Note that although the drain electrode 17 is formed in the first contact metal film forming step S6 in the present embodiment, but may be formed in a separately provided step.

In a case where nickel is used as a contact metal, nickel silicide is formed at an interface during annealing to generate free carbon, and as a result, adhesion between silicon carbide and a contact metal film decreases. Meanwhile, in the present embodiment, since free carbon is not generated during annealing, the adhesion of the first contact metal film 101 can be maintained.

(S7: Second Contact Metal Film Forming Step)

Figure 5B:
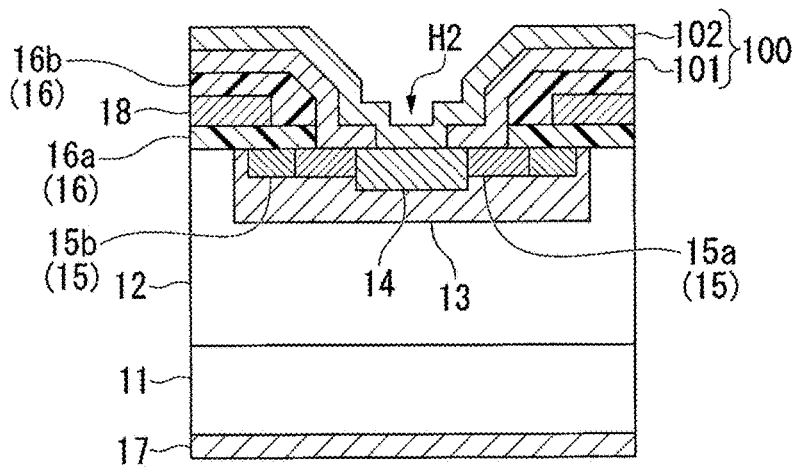
FIG. 5B is a cross-sectional view showing the method of manufacturing the semiconductor device according to the first embodiment.

Next, the second contact metal film forming step S7 shown in FIG. 5B is performed. In the second contact metal film forming step S7, first, a film of titanium is formed by sputtering or electron beam evaporation on a surface of the high-concentration region 14 exposed in the first contact metal film 101 and the second opening H2. Then, a publicly known photolithography technique is used to form a resist pattern (not shown) that protects a part corresponding to a second contact metal 102. Then, a part not protected by the resist pattern is removed by dry etching. Then, the resist pattern is removed. Then, the mask is removed. Next, annealing is performed as in the first contact metal film forming step S6. Thus, the second contact metal film 102 is formed on the surface of the first contact metal film 101 so that the second contact metal film 102 is in contact with the high-concentration region 14 in the second opening H2.

Note that in a case where an annealing atmosphere includes nitrogen, titanium nitride is formed on at least a surface layer part of the second contact metal 102.

(S8: Source Electrode Film Forming Step)

Figure 5C:
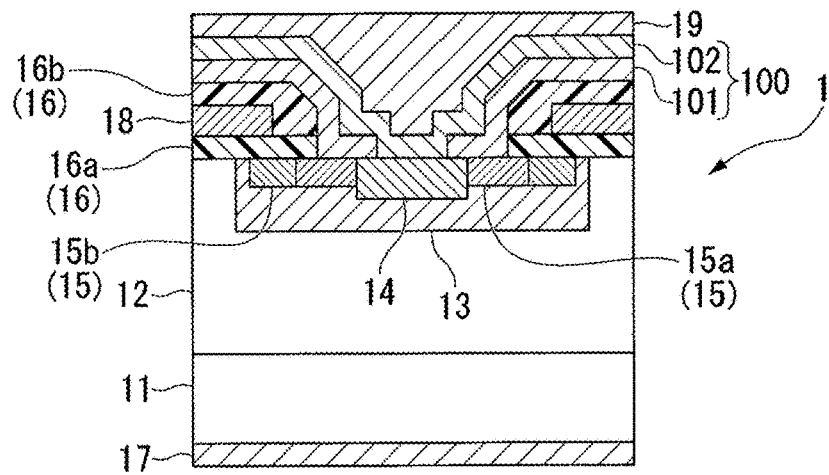
FIG. 5C is a cross-sectional view showing the method of manufacturing the semiconductor device according to the first embodiment.

Finally, the source electrode film forming step S8 shown in FIG. 5C is performed. In the source electrode film forming step S8, a film of an alloy including aluminum and silicon, an alloy including aluminum and copper, or aluminum is formed on a surface of the contact metal layer 100 by sputtering. Thus, the source electrode film 19 to be connected to the source regions 15 of the plurality of semiconductor elements is formed on the surface of the contact metal layer 100. Note that a part of the source electrode film 19 that is not necessary for connection to the source region 15 is appropriately removed by etching. At this time, when dry etching is used, a peripheral part of a device and unnecessary parts of the contact metal film 100 can be removed at the same time. With the above, the manufacturing of the semiconductor device 1 is completed.

In the method of manufacturing the semiconductor device 1 according to the present embodiment, nickel is not used for forming the contact metal film 100 (first contact metal film 101 and second contact metal film 102). Thus, free carbon is not generated during annealing, so that the adhesion between the contact metal layer 100 and the silicon carbide (source region 15 and high-concentration region 14) can be improved.

In the method of manufacturing the semiconductor device 1 according to the present embodiment, the second contact metal film 102 in contact with the central part of the high-concentration region 14 is formed of titanium. Thus, the contact resistance between the high-concentration region 14 ($SiC(p^+)$) including the p-type impurity and the contact metal layer 100 can be reduced as compared with a case where the contact metal layer 100 is entirely formed of titanium nitride.

As described above, according to the method of manufacturing the semiconductor device 1 of the present embodiment, an improvement in the adhesion of the contact metal layer 100 in the high-concentration region 14 and a reduction in the contact resistance can be achieved. Thus, a highly reliable semiconductor device can be provided.

Additionally, in the method of manufacturing the semiconductor device 1 according to the present embodiment, titanium is not used for forming the first contact metal film 101 of the contact metal layer 100 in contact with the source region 15. Thus, a Schottky junction is not formed at an interface between the contact metal layer 100 and the source region 15 including the n-type impurity. Therefore, an ohmic contact can be formed between the source region 15 and the source electrode film 19.

Additionally, in the semiconductor device 1 according to the present embodiment, the contact metal film 101 with respect to the source region 15 mainly including the n-type impurity and the contact metal film 102 with respect to the high-concentration region 14 including the p-type impurity are not separated from each other and instead are formed while being overlapped on the source region 15. Thus, a margin for a photolithography process can be reduced. As a result, a cell pitch of the semiconductor element can be reduced and a manufacturing cost can be reduced. Additionally, a contact metal 100 may be formed so that a first contact metal 101 is in contact with only a part of the source region 15 and the second contact metal 102 is in contact with both a part of the source region 15 and the high-concentration region 14.

Second Embodiment

Hereinafter, a second embodiment of the present invention will be described with reference to FIGS. 6 to 9. Description of parts in common with the first embodiment will be omitted.

(Configuration of Semiconductor Device)

Figure 6:
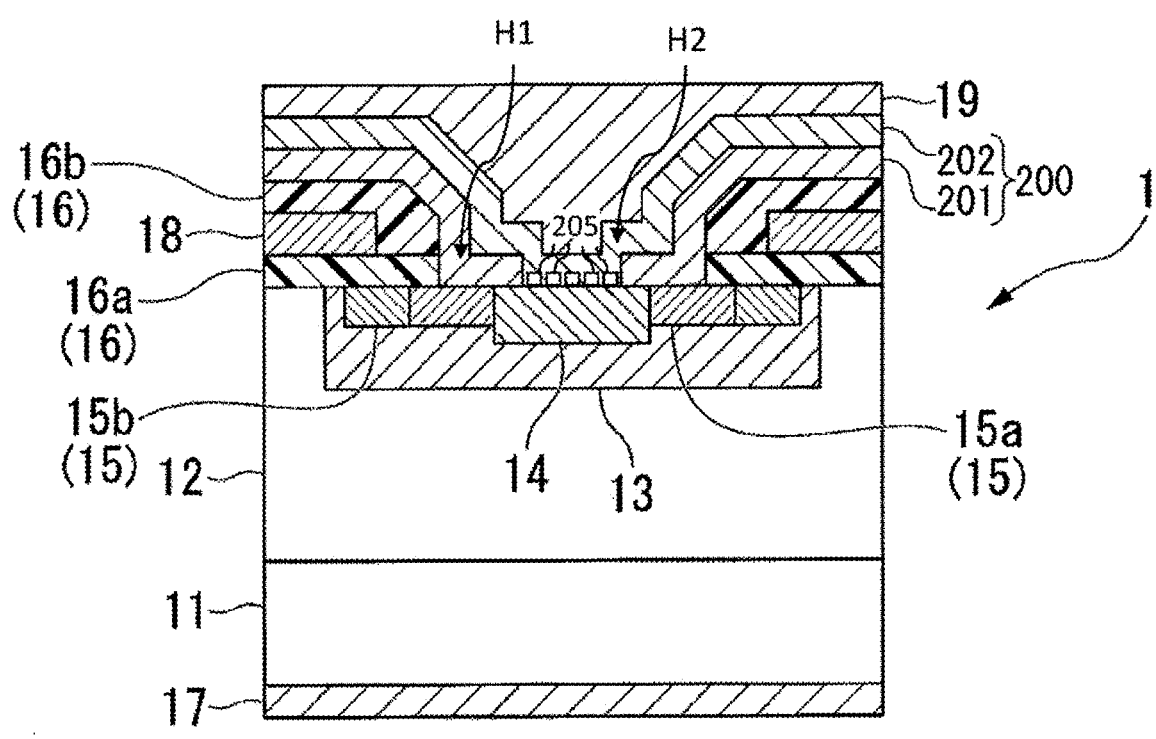
FIG. 6 is a cross-sectional view showing a configuration of a semiconductor device according to a second embodiment.

As shown in FIG. 6, in a semiconductor device 2 of the present embodiment, a contact metal layer 100 contains nickel silicide 205 that is particulate and provided on a contact surface with a high-concentration region 14. The contact metal layer 100 may contain titanium carbide.

In the semiconductor device 2 according to the present embodiment, free carbon generated by a reaction between nickel and silicon carbide during annealing is absorbed as titanium carbide in a second contact metal film 202 due to a reaction with titanium, so that adhesion between a contact metal layer 200 and silicon carbide (source region 15 and high-concentration region 14) can be improved.

In the semiconductor device 2 according to the present embodiment, the second contact metal film 202 in contact with the central part of the high-concentration region 14 has the nickel silicide 205 in a part thereof. Thus, contact resistance between the high-concentration region 14 (SiC ($p^+$)) including a p-type impurity and the contact metal layer 200 can be reduced as compared with a case where the contact metal layer 200 is entirely formed of titanium nitride.

As described above, according to the semiconductor device 2 of the present embodiment, an improvement in the adhesion of the contact metal layer 200 in the high-concentration region 14 and a reduction in the contact resistance can be achieved. Thus, a highly reliable semiconductor device can be provided.

Additionally, in the semiconductor device 2 according to the present embodiment, the second contact metal film 202 having the nickel silicide 205 at least in a part of a contact part with the high-concentration region 14 is provided. Thus, resistance between the high-concentration region 14 and a source electrode film 19 can be reduced as compared with the first embodiment.

Additionally, in the semiconductor device 2 according to the present embodiment, titanium is not used for forming a first contact metal film 201 of the contact metal layer 200 in contact with the source region 15. Thus, a Schottky junction is not formed at an interface between the contact metal layer 200 and the source region 15 including an n-type impurity. Therefore, an ohmic contact can be formed between the source region 15 and the source electrode film 19.

Additionally, in the semiconductor device 2 according to the present embodiment, a contact metal film 201 with respect to the source region 15 mainly including the n-type impurity and a contact metal film 202 with respect to the high-concentration region 14 mainly including the p-type impurity are not separated from each other and instead are formed while being overlapped on the source region 15. As a result, a margin for a photolithography process can be reduced, so that a cell pitch of the semiconductor element can be reduced.

(Method of Manufacturing Semiconductor Device)

Hereinafter, a method of manufacturing the semiconductor device 2 according to the present embodiment will be described with reference to FIGS. 7 to 9.

Figure 7:
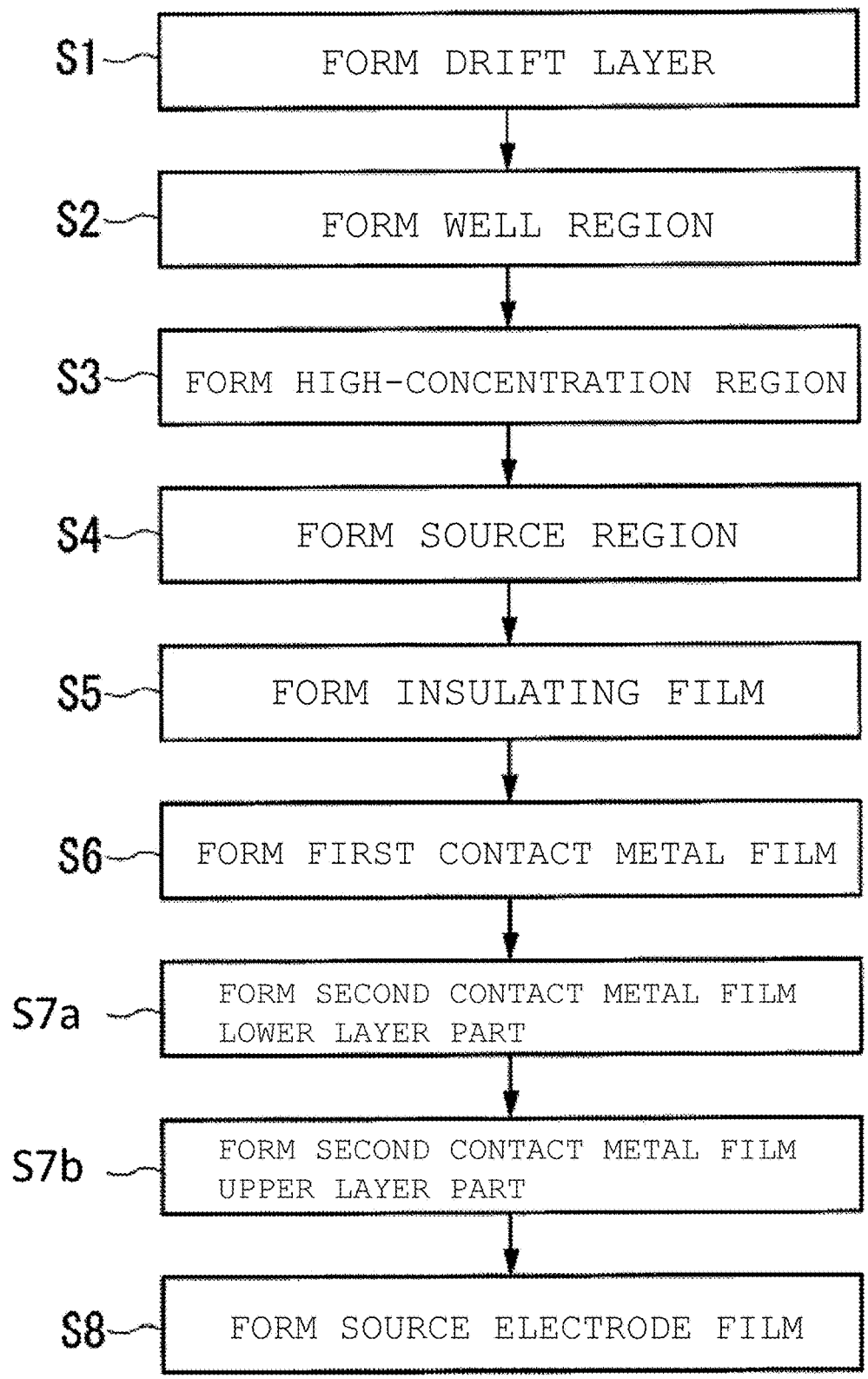
FIG. 7 is a flowchart showing a method of manufacturing the semiconductor device according to the second embodiment.

As shown in FIG. 7, a flow of the method of manufacturing the semiconductor device 2 according to the present embodiment is configured to be similar to that of the first embodiment, except that in place of the second contact metal film forming step S7, the flow of the method of manufacturing the semiconductor device 2 according to the present embodiment includes a second contact metal film lower layer part forming step S7a of forming a lower layer part of a second contact metal film 202 and includes a second contact metal film upper layer part forming step S7b of forming an upper layer part of the second contact metal film 202 between the second contact metal film lower layer part forming step S7a and a source electrode film forming step S8.

(S6: First Contact Metal Film Forming Step)

Figure 8A:
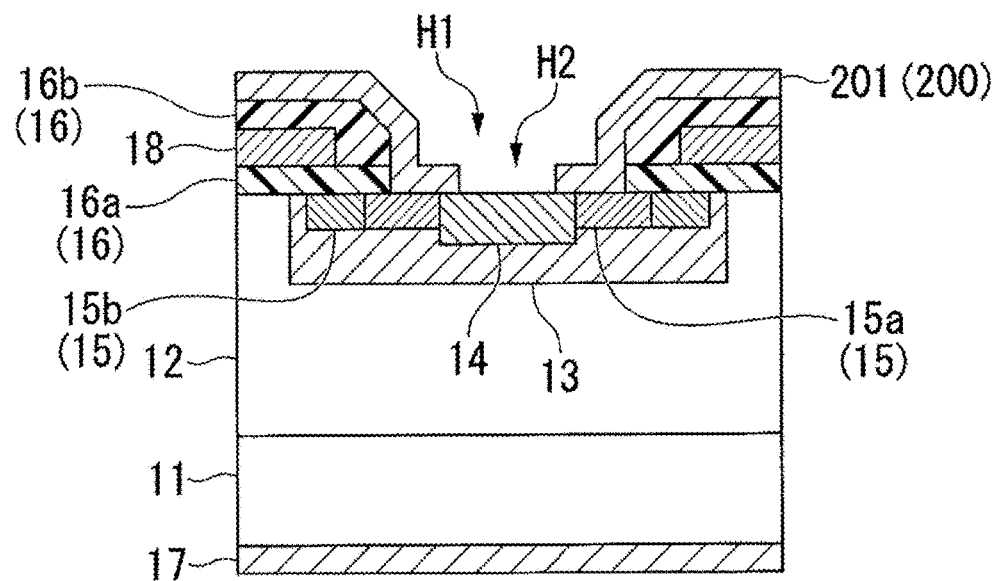
FIG. 8A is a cross-sectional view showing the method of manufacturing the semiconductor device according to the second embodiment.

As shown in FIG. 8A, in a first contact metal film forming step S6, a first contact metal film 201 is formed of titanium nitride, as in the first embodiment.

(S7a: Second Contact Metal Film Lower Layer Part Forming Step)

Figure 8B:
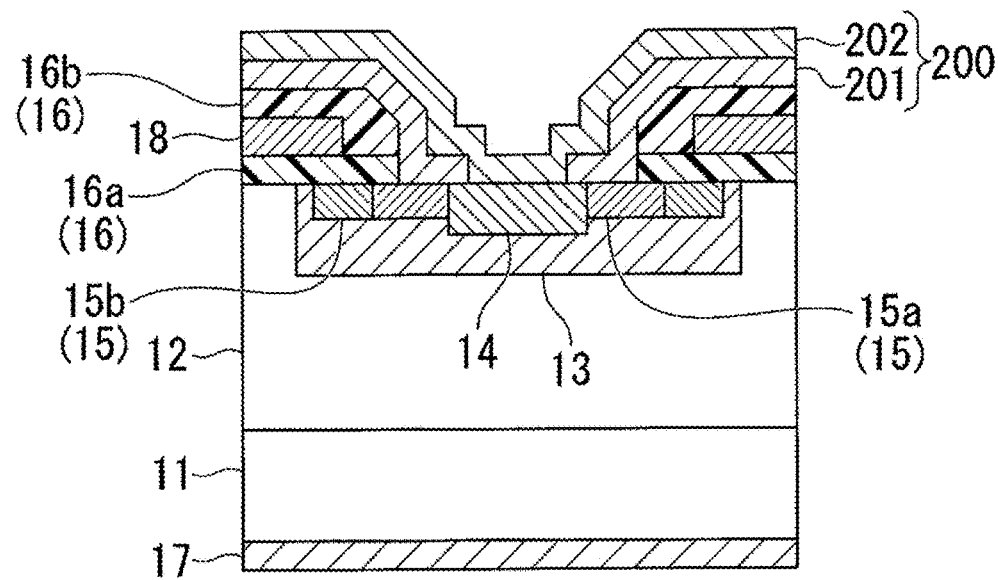
FIG. 8B is a cross-sectional view showing the method of manufacturing the semiconductor device according to the second embodiment.

As shown in FIG. 8B, in the second contact metal film lower layer part forming step S7, the lower layer part of the second contact metal film 202 is formed of titanium, as in the first embodiment. However, in the present embodiment, annealing is not performed here.

(S7b: Second Contact Metal Film Upper Layer Part Forming Step)

Next, the second contact metal film upper layer part forming step S7b is performed. In a second contact metal film forming upper layer part step S7b, first, by sputtering or electron beam evaporation, a film of nickel is formed on a surface of the titanium that is the lower layer part of the second contact metal film 202 and a surface of the high-concentration region 14 exposed in a second opening H2. Then, a publicly known photolithography technique may be used to form a resist pattern (not shown) that protects a part corresponding to a second contact metal 202. Then, a part not protected by the resist pattern may be removed by wet etching, and then the resist pattern may be removed. Then, the mask may be removed. Next, annealing is performed as in the first contact metal film forming step S6. At this time, the titanium nitride does not substantially react with the nickel and the titanium, but as the nickel and the titanium are mixed, the nickel penetrates a titanium layer and reacts with the silicon carbide forming the high-concentration region 14 to become the nickel silicide 205 (see FIG. 9A), free carbon reacts with the titanium to become titanium carbide. In particular, the nickel silicide 205 is formed at least in the part of the contact part with the high-concentration region 14. Additionally, silicon included in the nickel silicide 205 also diffuses into the nickel in a part in which the nickel is mixed with the titanium, and the nickel in the part also becomes the nickel silicide 205. Thus, the second contact metal film 202 is formed on a surface of the first contact metal film 201 so that the second contact metal film 202 is in contact with the high-concentration region 14 in the second opening H2.

Note that in a case where an annealing atmosphere includes nitrogen, titanium nitride is formed on at least a surface layer part of the second contact metal film 202, as in the first embodiment.

Figure 9A:
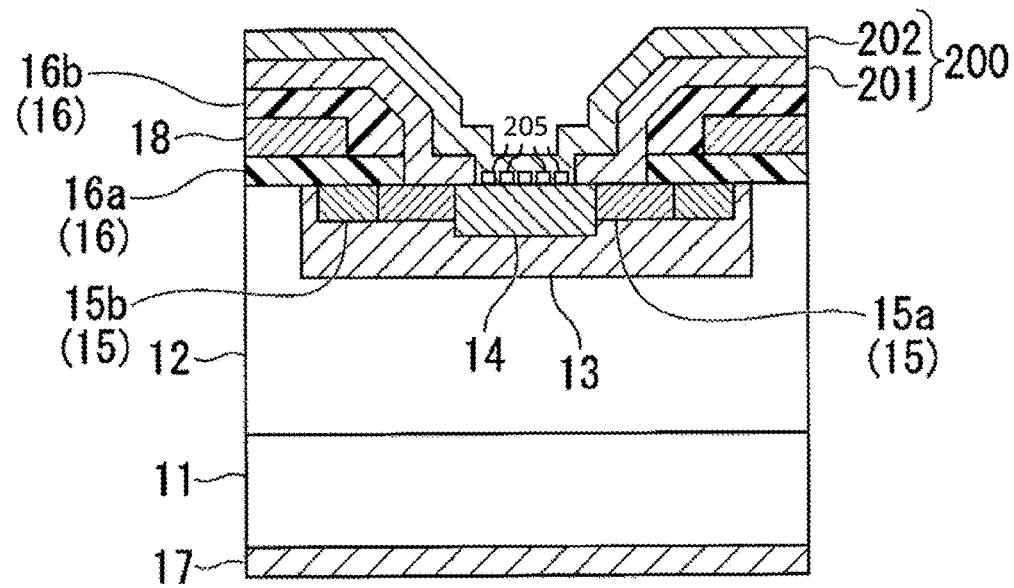
FIG. 9A is a cross-sectional view showing the method of manufacturing the semiconductor device according to the second embodiment.
Figure 9B:
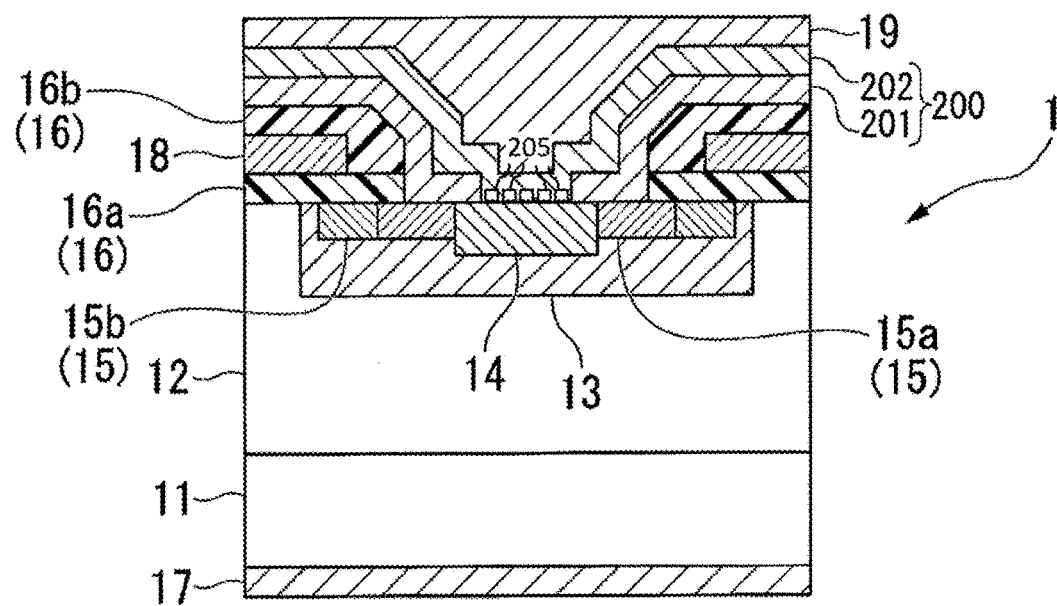
FIG. 9B is a cross-sectional view showing the method of manufacturing the semiconductor device according to the second embodiment.

As shown in FIG. 9B, in the source electrode film forming step S8, the source electrode film 19 is formed of an alloy including aluminum and silicon, an alloy including aluminum and copper, or aluminum on a surface of the contact metal layer 200, as in the first embodiment. With the above, the manufacturing of the semiconductor device 2 is completed.

In the semiconductor device 2 according to the present embodiment, free carbon generated by a reaction between nickel and silicon carbide during annealing is absorbed as titanium carbide in a second contact metal film 202 due to a reaction with titanium, so that adhesion between a contact metal layer 200 and silicon carbide (source region 15 and high-concentration region 14) can be improved.

In the method of manufacturing the semiconductor device 2 according to the present embodiment, the second contact metal film 202 in contact with the central part of the high-concentration region 14 is formed so that the second contact metal film 202 has the nickel silicide 205 at least in the part of the contact part with the high-concentration region 14. Thus, contact resistance between the high-concentration region 14 (SiC($p^+$)) including a p-type impurity and the contact metal layer 200 can be reduced as compared with a case where the contact metal layer 200 is entirely formed of titanium nitride.

As described above, according to the method of manufacturing the semiconductor device 2 of the present embodiment, an improvement in the adhesion of the contact metal layer 200 in the high-concentration region 14 and a reduction in the contact resistance can be achieved. Thus, a highly reliable semiconductor device can be provided.

Additionally, in the method of manufacturing the semiconductor device 2 according to the present embodiment, the second contact metal film 202 having the nickel silicide 205 at least in the part of the contact part with the high-concentration region 14 is provided. Thus, resistance between the high-concentration region 14 and a source electrode film 19 can be reduced as compared with the first embodiment.

Additionally, in the method of manufacturing the semiconductor device 2 according to the present embodiment, titanium is not used for forming the first contact metal film 201 of the contact metal layer 100 in contact with the source region 15. Thus, a Schottky junction is not formed at an interface between the contact metal layer 200 and the source region 15 including an n-type impurity. Therefore, an ohmic contact can be formed between the source region 15 and the source electrode film 19.

In the semiconductor device 2 according to the present embodiment, the contact metal film 201 with respect to the source region 15 mainly including the n-type impurity and the contact metal film 202 with respect to the high-concentration region 14 including the p-type impurity are not separated from each other and instead are formed while being overlapped on the source region 15. As a result, a margin for a photolithography process can be reduced, so that a cell pitch of the semiconductor element can be reduced.

Third Embodiment

Hereinafter, a third embodiment of the present invention will be described with reference to FIGS. 10 to 12. Description of parts in common with the first and second embodiments will be omitted.

(Configuration of Semiconductor Device)

Figure 10:
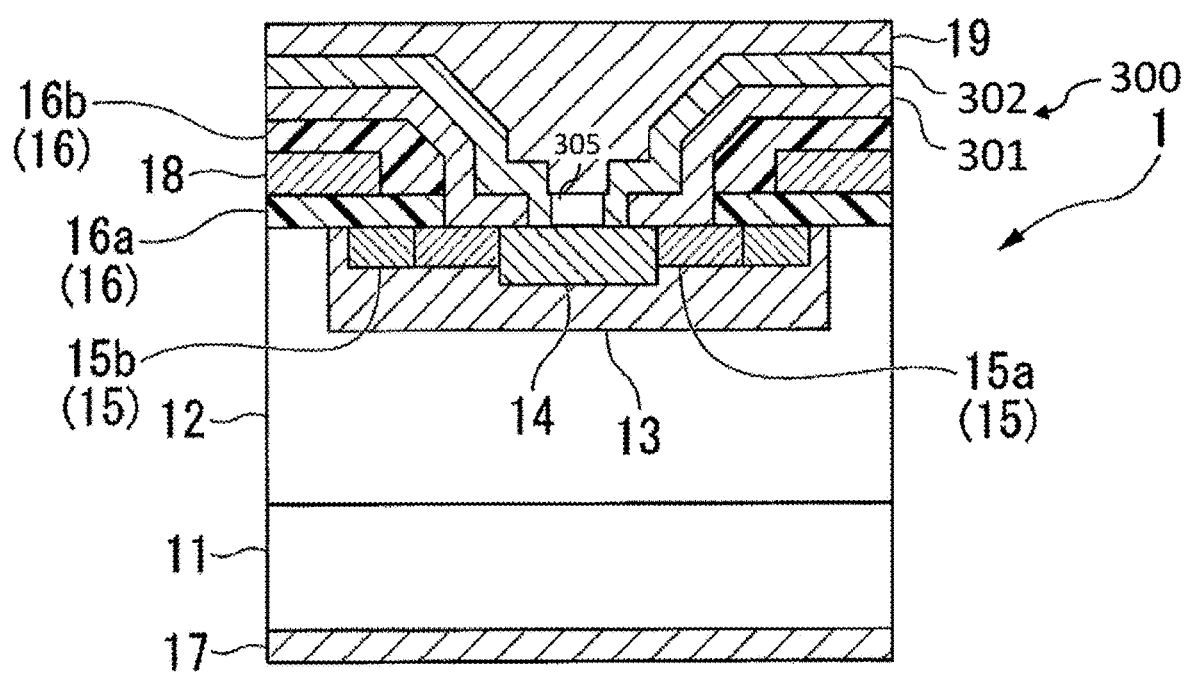
FIG. 10 is a cross-sectional view showing a configuration of a semiconductor device according to a third embodiment.

As shown in FIG. 10, in a semiconductor device 3 of the present embodiment, a contact metal layer 100 contains a nickel silicide layer 305 provided on a contact surface with a high-concentration region 14. The contact metal layer 100 may contain titanium carbide.

In the semiconductor device 3 according to the present embodiment, a second contact metal film 302 including nickel silicide and titanium carbide is in contact with the high-concentration region 14 in a region of a second opening H2 that is annular in a plan view and excludes a third opening H3. Furthermore, in a region of a first opening H1 that is annular in a plan view and excludes the second opening H2, a first contact metal film 301 formed of titanium nitride is in contact with the high-concentration region 14 and a source region 15. In these regions, free carbon generated during annealing is absorbed as titanium carbide by the second contact metal film 302. As a result, adhesion between silicon carbide and a contact metal film 300 does not decrease.

Meanwhile, the nickel silicide layer 305 is in contact with the high-concentration region 14 formed of silicon carbide in the third opening H3. Therefore, during annealing, free carbon is generated at an interface between the nickel silicide layer 305 and the high-concentration region 14.

However, the generated free carbon is absorbed by the second contact metal film 302 in contact with the above-described region of the first opening H1 that is annular in a plan view and excludes the second opening H2. As a result, a decrease in the adhesion between the silicon carbide and the contact metal film 300 can be prevented.

Furthermore, even if after annealing is performed in an inner side of the third opening H3 that is not in direct contact with the second contact metal film 302, the generated free carbon is not completely absorbed by the second contact metal film 302, a part of a contact metal layer 300 where the adhesion decreases is limited to the inner side of the third opening H3. Meanwhile, in a region that is annular in a plan view and surrounds the third opening H3 in an inner side of the first opening H1, the adhesion does not decrease. As a result, the contact metal layer 300 as a whole can maintain good adhesion to silicon carbide (high-concentration region 14 and source region 15). Note that as in the second embodiment, titanium nitride may be further formed on at least a surface layer part of the second contact metal film 302.

In the semiconductor device 3 according to the present embodiment, the nickel silicide layer 305 in contact with the central part of the high-concentration region 14 is provided. Thus, contact resistance between the high-concentration region 14 ($SiC(p^+)$) including a p-type impurity and the contact metal layer 300 can be reduced as compared with a case where the contact metal layer 300 is entirely formed of titanium nitride.

As described above, according to the semiconductor device 3 of the present embodiment, good adhesion of the contact metal layer 300 in the high-concentration region 14 can be maintained and a reduction in the contact resistance can be achieved. Thus, a highly reliable semiconductor device can be provided.

Additionally, in the semiconductor device 3 according to the present embodiment, the nickel silicide layer 305 is in contact with the high-concentration region 14 formed of silicon carbide in the third opening H3. Thus, resistance between the high-concentration region 14 and a source electrode film 19 can be reduced as compared with the second embodiment.

Additionally, in the semiconductor device 3 according to the present embodiment, titanium is not used for forming the first contact metal film 301 of the contact metal layer 300 in contact with the source region 15. Thus, a Schottky junction is not formed at an interface between the contact metal layer 300 and the source region 15 including an n-type impurity. Therefore, an ohmic contact can be formed between the source region 15 and the source electrode film 19.

Additionally, in the semiconductor device 3 according to the present embodiment, a contact metal film 301 with respect to the source region 15 mainly including the n-type impurity and a contact metal film 302 with respect to the high-concentration region 14 including the p-type impurity are not separated from each other and instead are formed while being overlapped on the source region 15. As a result, a margin for a photolithography process can be reduced, so that a cell pitch of the semiconductor element can be reduced.

(Method of Manufacturing Semiconductor Device)

Hereinafter, a method of manufacturing the semiconductor device 3 according to the present embodiment will be described with reference to FIGS. 11 and 12.

(S6: First Contact Metal Film Forming Step)

Figure 11A:
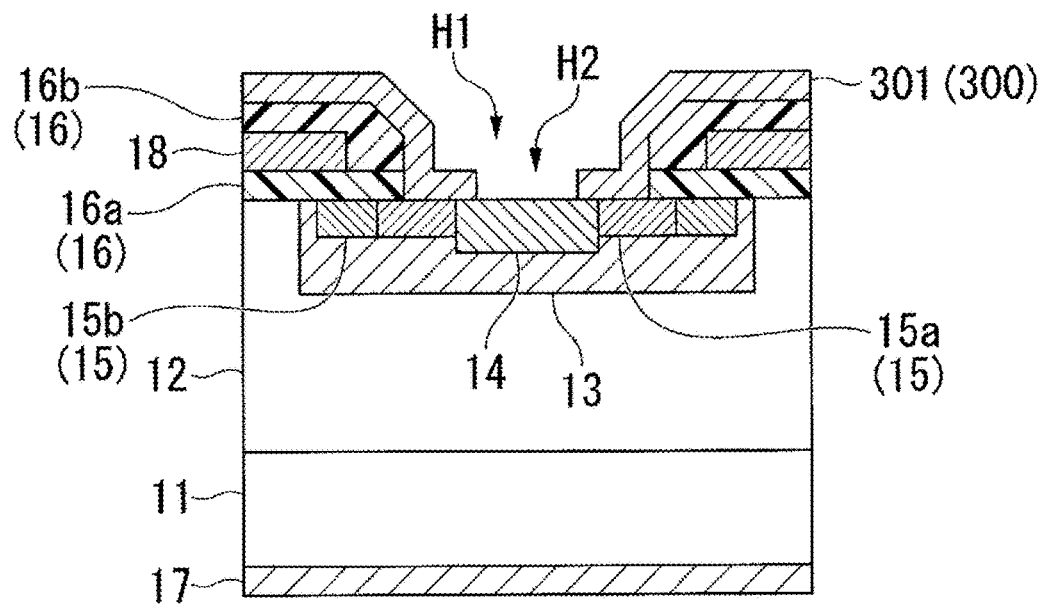
FIG. 11A is a cross-sectional view showing a method of manufacturing the semiconductor device according to the third embodiment.

As shown in FIG. 11A, in a first contact metal film forming step S6, the first contact metal film 301 is formed of titanium nitride, as in the second embodiment.

(S7: Second Contact Metal Film Forming Step)

Figure 11B:
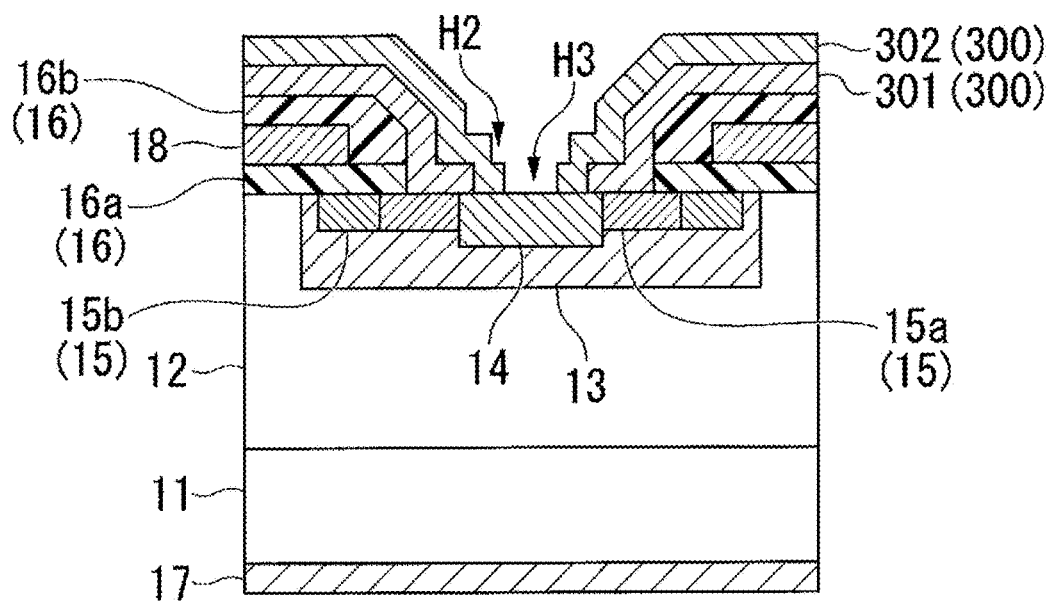
FIG. 11B is a cross-sectional view showing the method of manufacturing the semiconductor device according to the third embodiment.

As shown in FIG. 11B, in a second contact metal film forming step S7, the second contact metal film 302 is formed of titanium. The second contact metal film 302 is formed so as to have the third opening H3 formed so that a part of the high-concentration region 14 is exposed.

Figure 12A:
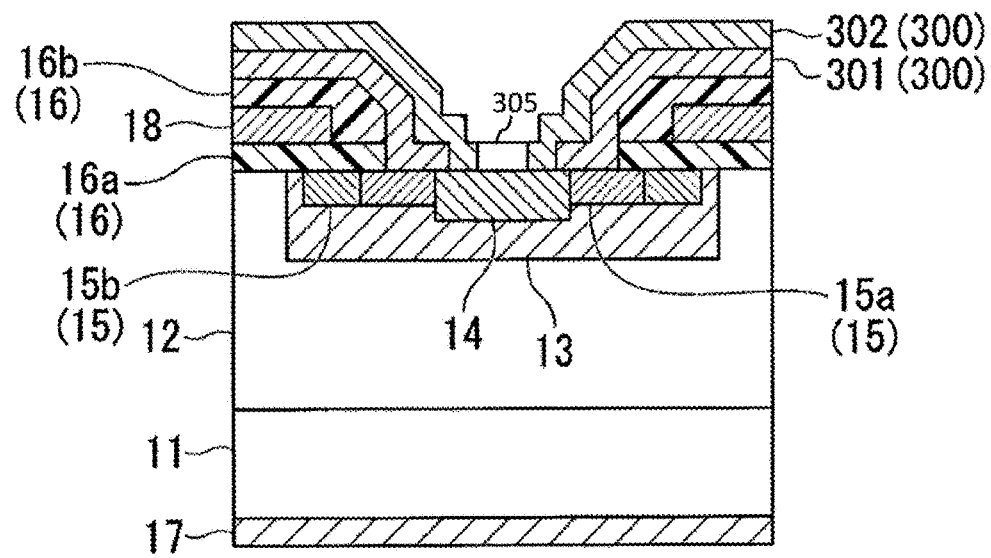
FIG. 12A is a cross-sectional view showing the method of manufacturing the semiconductor device according to the third embodiment.

As shown in FIG. 12A, a film of nickel is formed by sputtering or electron beam evaporation on a surface of the titanium that is the second contact metal film 302 and a surface of the high-concentration region 14 exposed in the third opening H3. Next, annealing is performed. At this time, the nickel mixes with titanium on the titanium, penetrates titanium in the third opening H3 directly and titanium in a part of the second opening H2 other than the third opening H3, and reacts with the silicon carbide forming the high-concentration region 14 to become nickel silicide (nickel silicide layer forming step), and free carbon reacts with titanium to become titanium carbide. Additionally, silicon included in the nickel silicide also diffuses into the nickel in a part in which the nickel is mixed with the titanium, and the nickel in the part also becomes nickel silicide. Thus, the second contact metal film 302 including nickel silicide and titanium carbide is formed, and the nickel silicide layer 305 is formed so as to be in contact with the high-concentration region 14 in the third opening H3. Note that in a case where an annealing atmosphere includes nitrogen, titanium nitride is formed on at least the surface layer part of the second contact metal film 302, as in the first and second embodiments.

Figure 12B:
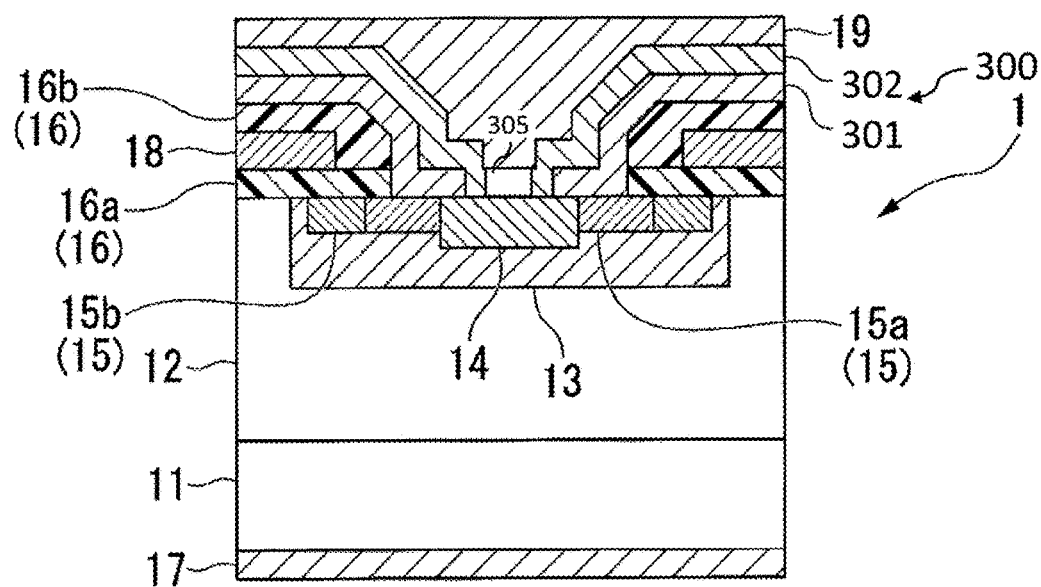
FIG. 12B is a cross-sectional view showing the method of manufacturing the semiconductor device according to the third embodiment.

As shown in FIG. 12B, in a source electrode film forming step S8, the source electrode film 19 is formed of an alloy including aluminum and silicon, an alloy including aluminum and copper, or aluminum on a surface of the contact metal layer 300, as in the first and second embodiments. Thus, the semiconductor device 3 is formed.

In the method of manufacturing the semiconductor device 3 according to the present embodiment, the second contact metal film 302 including nickel silicide and titanium carbide is in contact with the high-concentration region 14 in a region of the second opening H2 that is annular in a plan view and excludes the third opening H3. Furthermore, in a region of a first opening H1 that is annular in a plan view and excludes the second opening H2, a first contact metal film 301 formed of titanium nitride is in contact with the high-concentration region 14 and a source region 15. In these regions, free carbon generated during annealing is absorbed as titanium carbide by the second contact metal film 302. As a result, adhesion between silicon carbide and a contact metal film 300 does not decrease. Meanwhile, the nickel silicide layer 305 is in contact with the high-concentration region 14 formed of silicon carbide in the third opening H3. Therefore, during annealing, free carbon is generated at an interface between the nickel silicide layer 305 and the high-concentration region 14.

However, the generated free carbon is absorbed by the second contact metal film 302 in contact with the above-described region of the first opening H1 that is annular in a plan view and excludes the second opening H2. As a result, a decrease in the adhesion between the silicon carbide and the contact metal film 300 can be prevented.

Furthermore, even if after annealing is performed in an inner side of the third opening H3 that is not in direct contact with the second contact metal film 302, the generated free carbon is not completely absorbed by the second contact metal film 302, a part of a contact metal layer 300 where the adhesion decreases is limited to the inner side of the third opening H3. Meanwhile, in a region that is annular in a plan view and surrounds the third opening H3 in an inner side of the first opening H1, the adhesion does not decrease. As a result, the contact metal layer 300 as a whole can maintain good adhesion to silicon carbide (high-concentration region 14 and source region 15).

In the method of manufacturing the semiconductor device 3 according to the present embodiment, the nickel silicide layer 305 in contact with the central part of the high-concentration region 14 is provided. Thus, contact resistance between the high-concentration region 14 ($SiC(p^+)$) including a p-type impurity and the contact metal layer 300 can be reduced as compared with a case where the contact metal layer 300 is entirely formed of titanium nitride.

As described above, according to the method of manufacturing the semiconductor device 3 of the present embodiment, good adhesion of the contact metal layer 300 in the high-concentration region 14 can be maintained and a reduction in the contact resistance can be achieved. Thus, a highly reliable semiconductor device can be provided.

Additionally, in the method of manufacturing the semiconductor device 3 according to the present embodiment, the nickel silicide layer 305 is in contact with the high-concentration region 14 formed of silicon carbide in the third opening H3. Thus, resistance between the high-concentration region 14 and a source electrode film 19 can be reduced as compared with the second embodiment.

Additionally, in the method of manufacturing the semiconductor device 3 according to the present embodiment, titanium is not used for forming the first contact metal film 301 of the contact metal layer 300 in contact with the source region 15. Thus, a Schottky junction is not formed at an interface between the contact metal layer 300 and the source region 15 including an n-type impurity. Therefore, an ohmic contact can be formed between the source region 15 and the source electrode film 19.

Additionally, in the semiconductor device 3 according to the present embodiment, the contact metal film 301 with respect to the source region 15 mainly including the n-type impurity and the contact metal film 302 with respect to the high-concentration region 14 including the p-type impurity are not separated from each other and instead are formed while being overlapped on the source region 15. Thus, a margin for a photolithography process can be reduced. As a result, a cell pitch of the semiconductor element can be reduced and a manufacturing cost can be reduced.

Although the embodiments of the present invention have been described above, the present invention can be implemented in other forms. For example, the source electrode film 19 is formed of an alloy including aluminum and silicon, an alloy including aluminum and copper, or aluminum, but a conductive material such as another metal may be used. Additionally, the semiconductor devices 1, 2, and 3 are planar type MOSFETs, but may be insulated gate bipolar transistors (IGBTs) using a $p^+$-type (second conductivity type) silicon carbide single crystal substrate as the semiconductor substrate 11. Additionally, in the above embodiments, the first conductivity type is n-type and the second conductivity type is p-type, but the first conductivity type may be p-type and the second conductivity type may be n-type.

Additionally, the above embodiments adopt a "square cell structure" in which the source region 15 is surrounded by the well region 13 in a plan view, is formed in an annular shape, is formed adjacent to the high-concentration region 14, and surround the high-concentration region 14 in a plan view, but the embodiments are not limited to this configuration. The semiconductor device of the present invention may have a "stripe cell structure" having a cross section shown in, for example, FIG. 1, 6, or 10. In this case, the well region 13 is a region extending in a direction substantially perpendicular to a cross section of the semiconductor device in a plan view. The high-concentration region 14 is a region included in the well region 13 and extending in the same direction as a direction of the well region 13 in a plan view. The source region 15 is a pair of regions that are included in the well region 13 in a plan view and extend adjacent to both sides of the high-concentration region 14.

Additionally, the first opening H1 is configured to be formed so that at least a part of the source region 15 and at least a part of a high-concentration second conductivity type region 14 are exposed in a plan view, but the configuration is not limited to this configuration. The first opening H1 may be formed so that at least a part of the high-concentration second conductivity type region 14 exposed without the source region 15 being exposed in a plan view.

In addition, various design changes can be made within the scope of the matters described in the claims.

REFERENCE SIGNS LIST 1, 2, 3 Semiconductor device
11 Semiconductor substrate
12 Drift layer
13 Well region
14 High-concentration region
15 Source region
16 Insulation film
19 Source electrode film
100, 200, 300 Contact metal layer
101, 201, 301 First contact metal film
102, 202, 302 Second contact metal film
305 Nickel silicide layer
F1 One main surface
H1 First opening
H2 Second opening
H3 Third opening
S1 Drift layer forming step
S2 Well region forming step
S3 High-concentration region forming step
S4 Source region forming step
S5 Insulating film forming step
S6 First contact metal film forming step
S7 Second contact metal film forming step
S7a Second contact metal film lower layer part forming step
S7b Second contact metal film upper layer part forming step
S8 Source electrode film forming step

The invention claimed is:

1. A semiconductor device comprising:
   a semiconductor substrate made of silicon carbide;
   a drift layer of a first conductivity type and provided on one main surface of the semiconductor substrate;
   a well region of a second conductivity type and provided in the drift layer;
   a high-concentration region of the second conductivity type, provided in the well region and having an impurity concentration higher than an impurity concentration of the well region;
   a source region of the first conductivity type and provided adjacent to the high-concentration region;
   an insulating film provided on the drift layer;
   a first contact metal film in contact with the source region and the high-concentration region through a first opening provided in the insulating film; and
   a second contact metal film formed on a surface of the first contact metal film and contacting the high-concentration region through a second opening provided in the first contact metal film;
   a source electrode film formed on a contact metal layer including the first contact metal film and the second contact metal film, the source electrode film made of an alloy including aluminum and silicon, an alloy including aluminum and copper, or aluminum,
wherein
   the source electrode film is provided on a surface of the second contact metal film,
   the first contact metal film includes titanium nitride, and
   the second contact metal film includes titanium.

2. The semiconductor device according to claim 1, wherein
   the second contact metal film includes nickel silicide provided on a contact surface with the high-concentration region.

3. The semiconductor device according to claim 2, wherein
   the nickel silicide is particulate.

4. The semiconductor device according to claim 1, further comprising a nickel silicide layer in contact with the high-concentration region through a third opening provided in the second contact metal film.

5. A method of manufacturing a semiconductor device, the method comprising:
   a drift layer forming step of forming a drift layer of a first conductivity type on one main surface of a semiconductor substrate made of silicon carbide;
   a well region forming step of forming a well region of a second conductivity type opposite to the first conductivity type in the drift layer, the well region being exposed on a surface of the drift layer;
   a high-concentration region forming step of forming a high-concentration region of the second conductivity type in the well region of the drift layer, the high-concentration region being exposed on the surface of the drift layer, the high-concentration region having a higher impurity concentration than an impurity concentration in the well region;
   a source region forming step of forming a source region of the first conductivity type in the well region of the drift layer, the source region being exposed to the surface of the drift layer, the source region being adjacent to the high-concentration region;
   an insulating film forming step of forming an insulating film on the surface of the drift layer, the insulating film having an insulating film having a first opening exposing the high-concentration region and at least a part of the source region in a plan view viewed from a side of the one main surface of the semiconductor substrate;
   a first contact metal film forming step of forming a first contact metal film having a second opening exposing a part of the high-concentration region so that the first contact metal film is in contact with at least a part of the source region in the first opening;
   a second contact metal film forming step of forming a second contact metal film on a surface of the first contact metal film so that the second contact metal film is in contact with the high-concentration region in the second opening; and
   a source electrode film forming step of forming a source electrode film on a surface of a contact metal layer including the first contact metal film and the second contact metal film, the source electrode film made of an alloy including aluminum and silicon, an alloy including aluminum and copper, or aluminum,
wherein
   the source electrode film is provided on a surface of the second contact metal film,
   the first contact metal film includes titanium nitride, and
   the second contact metal film includes titanium.

6. The method of manufacturing a semiconductor device according to claim 5, wherein
the second contact metal film includes nickel silicide provided on a contact surface with the high-concentration region.

7. The method of manufacturing a semiconductor device according to claim 6, wherein
the nickel silicide is particulate.

8. The method of manufacturing a semiconductor device according to claim 5,
further comprising a nickel silicide layer forming step of providing a nickel silicide layer in contact with the high-concentration region through a third opening provided in the second contact metal film.

* * * * *